(12) United States Patent
Murase (10) Patent No.: US 7,814,455 B2
(45) Date of Patent: Oct. 12, 2010

(54) LOGIC SYNTHESIS METHOD AND DEVICE

(75) Inventor: Kouji Murase, Tokyo (JP)

(73) Assignee: NEC Engineering, Ltd., Tokyo (JP)

( * ) Notice: Subject to any disclaimer, the term of this patent is extended or adjusted under 35 U.S.C. 154(b) by 785 days.

(21) Appl. No.: 11/811,075

(22) Filed: Jun. 8, 2007

(65) Prior Publication Data
US 2008/0127026 A1    May 29, 2008

(30) Foreign Application Priority Data
Jun. 9, 2006    (JP) ............................. 2006-160374

(51) Int. Cl.
*G06F 17/50*    (2006.01)
(52) U.S. Cl. ........................................... 716/18; 716/2
(58) Field of Classification Search ................ 716/1, 716/2, 18
See application file for complete search history.

(56) References Cited

U.S. PATENT DOCUMENTS

| 6,530,073 B2 * | 3/2003 | Morgan ..................... 716/18 |
| 2003/0033595 A1 * | 2/2003 | Takagi et al. ................ 717/143 |

FOREIGN PATENT DOCUMENTS

| JP | 10-269271 | 10/1998 |
| JP | 2000-215217 | 8/2000 |
| JP | 2003-58597 | 2/2003 |
| JP | 2003-196335 | 7/2003 |

* cited by examiner

*Primary Examiner*—Jack Chiang
*Assistant Examiner*—Binh C Tat
(74) *Attorney, Agent, or Firm*—Scully, Scott, Murphy & Presser, P.C.

(57) ABSTRACT

The present invention provides a logic synthesis method and the like that can shorten the execution time and the confirmation time required for logic re-synthesis and logic equivalence checking. The logic synthesis method characteristically includes the steps of: extracting logically different portions between an existing gate level logic circuit and a modified Hardware Description Language (HDL) description; hierarchizing the different portions between the existing gate level logic circuit and the modified HDL description; generating a gate level logic circuit by logically combining the hierarchized portions of the modified HDL description; and replacing the hierarchized portions of the existing gate level logic circuit with the gate level logic circuit. By this method, a layer containing detected different portions is automatically generated in logic equivalence checking between a modified HDL and a gate level logic circuit, so that logic synthesis can be performed in a unit smaller than the unit for the conventional logic synthesis. Thus, the execution time and the confirmation time required for logic re-synthesis and logic equivalence rechecking can be shortened.

4 Claims, 9 Drawing Sheets

UNMODIFIED HDL
module (DIN1,DIN2,CLK,DOUT)
  input           DIN1,DIN2,CLK ;
  output        DOUT ;
  reg            reg1,reg2,reg3 ;
  always@(posedge CLK)
  begin
    reg1 <= DIN1 ;
    reg2 <= DIN2 ;
  end
  always@(reg1 or reg2)
  begin
    <u>reg3 <= reg1 & reg2;</u>
  end
  always(posedge CLK)
  begin
    DOUT <= reg3 ;
  end
endmodule ;

MODIFIED PORTION

19

MODIFIED HDL
module (DIN1,DIN2,CLK,DOUT)
  input           DIN1,DIN2,CLK ;
  output        DOUT ;
  reg            reg1,reg2,reg3 ;
  always@(posedge CLK)
  begin
    reg1 <= DIN1 ;
    reg2 <= DIN2 ;
  end
  always@(reg1 or reg2)
  begin
    <u>reg3 <= reg1 | reg2;</u>
  end
  always(posedge CLK)
  begin
    DOUT <= reg3 ;
  end
endmodule ;

UNMODIFIED HDL ~38
```
module (DIN1,DIN2,DIN3,CLK,DOUT1,DOUT2)
  input    DIN1,DIN2,DIN3,CLK ;
  output   DOUT1,DOUT2 ;
  reg      reg1,reg2,reg3,reg4 ;
  always@(posedge CLK)
  begin
    reg1 <= DIN1 ;
    reg2 <= DIN2 ;
    reg3 <= DIN3 ;
  end
  always@(reg1 or reg2)
  begin
    /* (INPUT PIN:2 OUTPUT PIN:1 AND GATE:1) */
    reg4 <= reg1 & reg2 ;
  end
  always@(posedge CLK)
  begin
    DOUT1 <= reg4 ;
    DOUT2 <= reg3 ;
  end
endmodule ;
```

MODIFIED HDL ~39
```
module (DIN1,DIN2,DIN3,CLK,DOUT1,DOUT2)
  input    DIN1,DIN2,DIN3,CLK ;
  output   DOUT1,DOUT2 ;
  reg      reg1,reg2,reg3,reg4 ;
  always@(posedge CLK)
  begin
    reg1 <= DIN1 ;
    reg2 <= DIN2 ;
    reg3 <= DIN3 ;
  end
  always@(reg1 or reg2 or reg3)
  begin
    /* (INPUT PIN:2 OUTPUT PIN:1 AND GATE: 1OR gate:1) */
    reg4 <= (reg1 & reg2) | reg3 ;
  end
  always@(posedge CLK)
  begin
    DOUT1 <= reg4 ;
    DOUT2 <= reg3 ;
  end
endmodule ;
```

MODIFIED PORTION

LOGIC SYNTHESIS METHOD AND DEVICE

This application is based upon and claims the benefit of priority from Japanese patent application No. 2006-160374, filed on Jun. 9, 2006, the disclosure of which is incorporated herein in its entirety by reference.

BACKGROUND OF THE INVENTION

1. Field of the Invention

The present invention pertains to a logic synthesis method and device utilizing an HDL (Hardware Description Language), and more particularly, to a logic synthesis method and device that automatically generates from an existing HDL an HDL with hierarchized modified portions.

2. Description of the Related Art

In a conventional LSI function design and logic design, a gate level logic circuit is automatically generated from an HDL such as a Verilog HDL or VHDL with the use of a logic synthesis tool. As for the gate level logic circuit automatically generated from an HDL by use of a logic synthesis tool, equivalence is checked and logic mismatch is detected with the use of a logic equivalence checking tool.

"Logic synthesis" is a technique for generating a gate level logic circuit represented by gate connections in accordance with the functional description written in an HDL, the target timing, and the circuit operation specification such as a circuit size restriction. "Logic equivalence checking" is a technique for checking logic equivalence by transforming an HDL and a gate level logic circuit to be checked into mathematical expressions.

Figure 6:
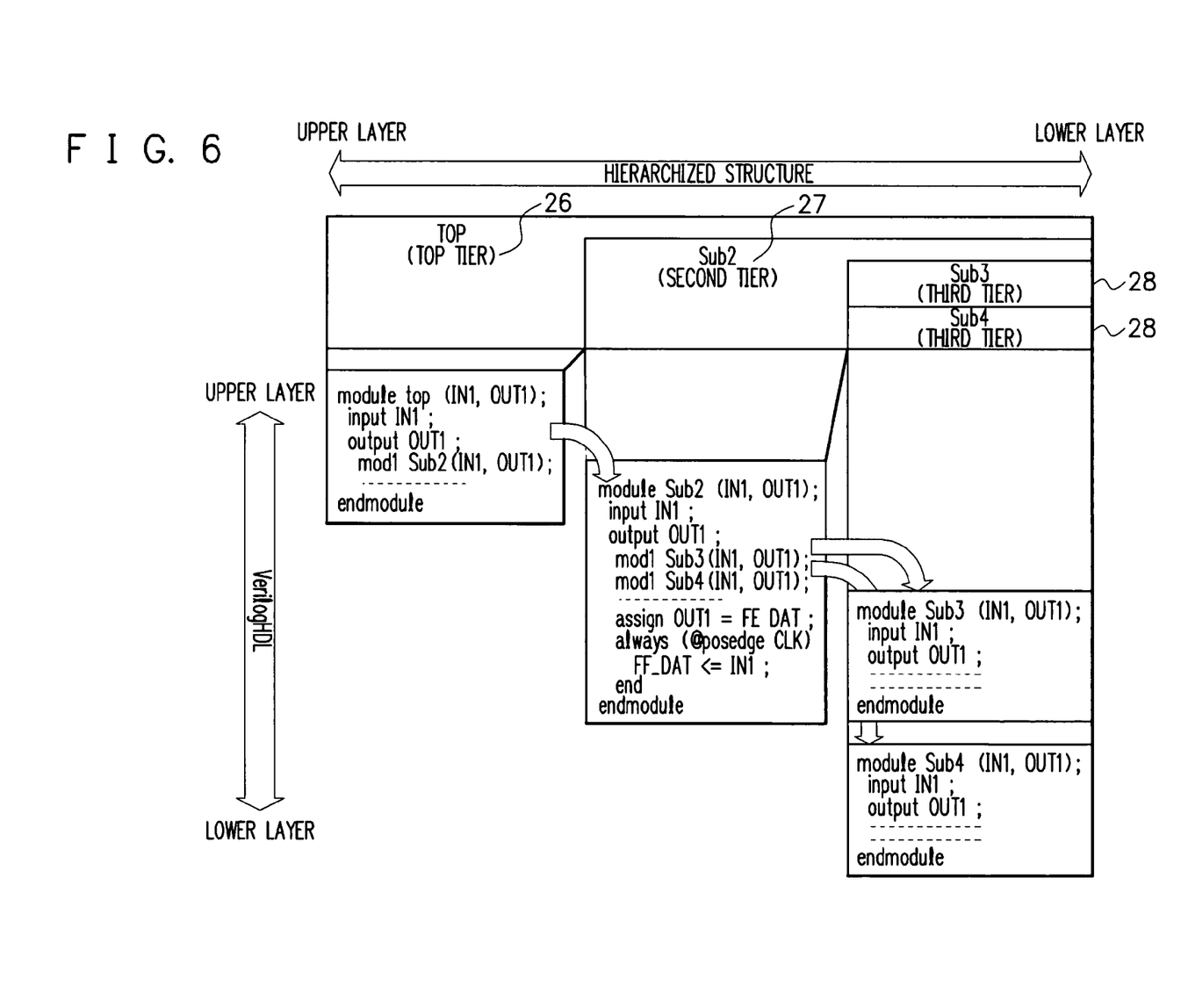
FIG. 6 shows a gate level logic circuit formed by hierarchizing different portions of a gate level logic circuit.

Referring now to FIG. 6, the functional description of an HDL that is a Verilog HDL is described.

FIG. 6 shows the hierarchical structure of an HDL. A TOP layer 26 includes a second layer 27, the second layer 27 includes third layers 28, and the upper layer includes the lower layer. Each layer describes the class inclusion and functions of lower layers between a "module" and an "endmodule". To describe a function between a "module" and an "endmodule", an "always" sentence and an "assign" sentence are used. An "always" sentence and an "assign" sentence constitute the smallest functional description unit in an HDL. Since the logic synthesis is performed on the "module" level having a clear input/output terminal, it is carried out for each "module" unit, such as "TOP", "Sub2", "Sub3", and "Sub4".

For example, in a case of logic synthesis in a Verilog HDL, each "module" is a unit for performing the logic synthesis. If a change needs to be made to a gate level logic circuit due to a modification to the functional specification or a breach of the design rules existing in the technology after the gate level logic circuit is automatically generated, logic re-synthesis is performed with the use of a logic synthesis tool by modifying the HDL. Since an HDL has a hierarchical structure formed with "modules", logic synthesis is performed for a "module". Logic re-synthesis after an HDL modification may be performed in an entire HDL. To shorten the execution time required for logic synthesis, however, a gate level logic circuit is automatically generated in the subject layer by performing logic synthesis in the "module" containing a portion to be modified. The existing gate level logic circuit in the layer requiring a modification is then replaced with the automatically generated gate level logic circuit.

Figure 7:
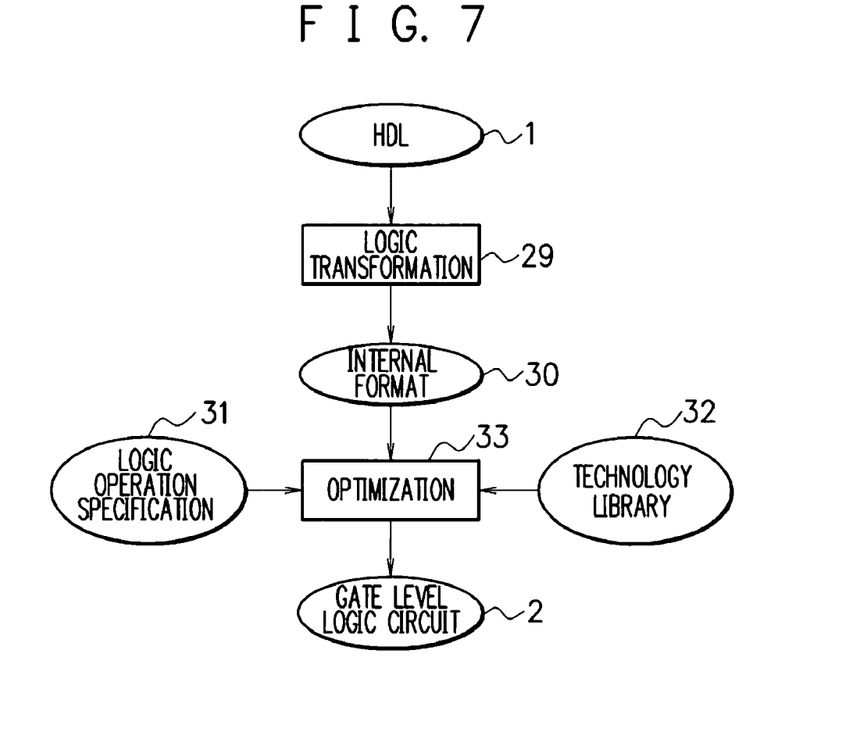
FIG. 7 shows a logic synthesis tool operation flow.

Referring now to FIG. 7, an operation flow of the above described logic synthesis tool is described.

The logic synthesis tool carries out a syntax analysis of an HDL 1, to generate an internal format 30 represented in a mathematical expression through a logic transformation 29. Based on the internal format 30, a circuit operation specification 31, and a technology library 32, optimization 33 is performed so that a gate level logic circuit 2 can be automatically generated.

Figure 8:
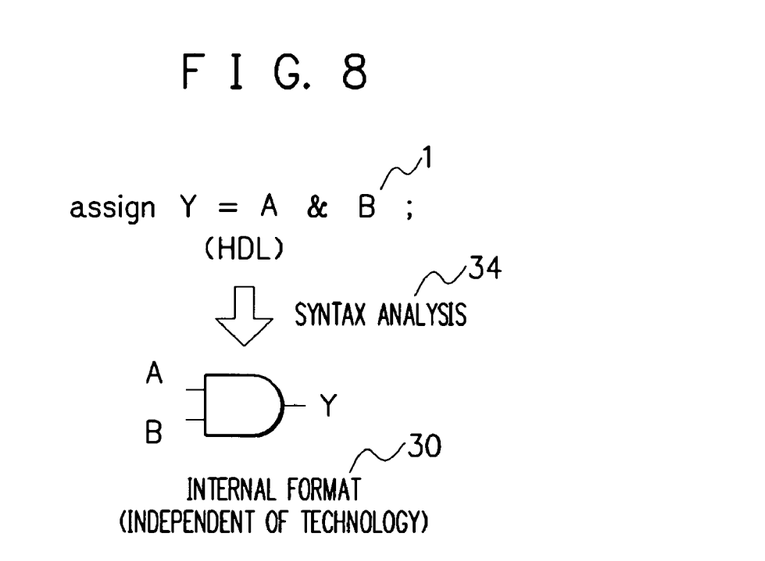
FIG. 8 shows a logic transformation.

As shown in FIG. 8, in the logic transforming procedure, a transformation into the internal format 30 independent of the technology is carried out after a syntax analysis 34 of the HDL 1.

Figure 9:
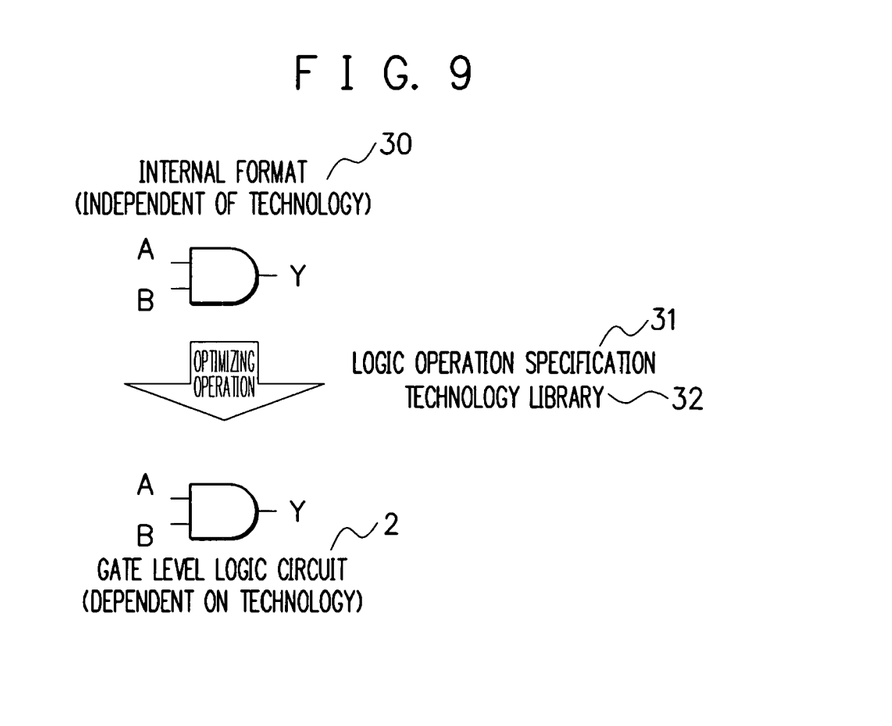
FIG. 9 shows a logic synthesis optimizing operation.

As shown in FIG. 9, in the optimizing procedure, mapping from the internal format 30 to the gate level logic circuit 2 is performed with the technology library 32. Also, mapping to the gate level logic circuit 2 is performed so as to satisfy the circuit operation specification 31 with respect to the circuit size, the delay time, and the like.

Figure 10:
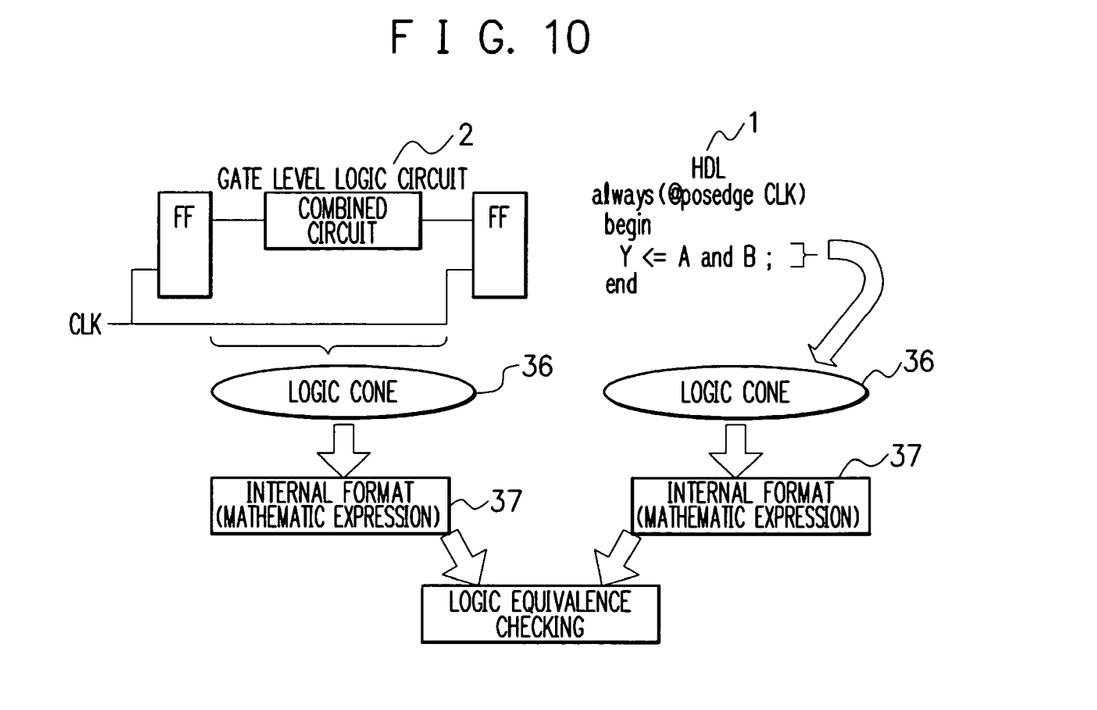
FIG. 10 shows a method for checking logic equivalence.

Referring now to FIG. 10, a method for determining whether circuits automatically generated with an HDL and a logic synthesis tool are logically equivalent to each other is described.

A combined circuit parted by FFs (flip-flops) that are a sequential circuit is extracted as a logic cone 36 from the gate level logic circuit 2. A logic cone 36 is also extracted from the HDL. The extracted logic cones 36 are transformed into internal formats (mathematical expressions) 37, and checking is performed to determine whether the internal formats 37 are logically equivalent to each other.

Japanese Patent Application Laid-Open (JP-A) Nos. 2003-196335 (document 1), 2000-215217 (document 2), 10-269271 (document 3) disclose examples of methods for logic resynthesis to be performed when a gate level logic circuit is modified. JP-A No. 2003-058597 (document 4) discloses an example of a difference determining method to be utilized in logic equivalence checking between an HDL and a gate level logic circuit.

In the above described conventional LSI function designs and logic designs, logic re-synthesis is performed with a logic synthesis tool so as to automatically generate a gate level logic circuit after the HDL is modified, if a modification needs to be made to a gate level logic circuit due to a change in functional specification or a breach of the design rules depending on the technology after the gate level logic circuit is automatically generated from an HDL with the use of the logic synthesis tool. In the logic re-synthesis, the "entity" and the "module" containing the portion to be modified in the HDL is the smallest unit. The logic re-synthesis is performed on the "entity" and the "module" including the functional description that does not require a modification.

With respect to the portion on which the logic re-synthesis has been performed, logic equivalence between the HDL and the gate level logic circuit is checked again with the use of a logic equivalence checking tool. A large part of the HDL on which the logic re-synthesis is performed might not have any change in logic, and checking is unnecessarily performed on the portion on which logic equivalence between the HDL and the gate level logic circuit has already been confirmed. In today's increasingly large, highly-integrated, and sophisticated LSIs, the execution time for logic synthesis and logic equivalence checking is becoming longer and longer. Therefore, it is necessary to minimize the portion on which logic re-synthesis is to be performed, and to shorten the execution time for logic synthesis and logic equivalence checking.

The modifying means disclosed in document 2 and document 3, which makes a modification to an existing gate level logic circuit, extracts the different portions between an unmodified HDL and a modified HDL, generates a gate level logic circuit formed with the different portions, detects the different portions in the existing gate level logic circuit, and then performs a replacing operation.

Figure 11:
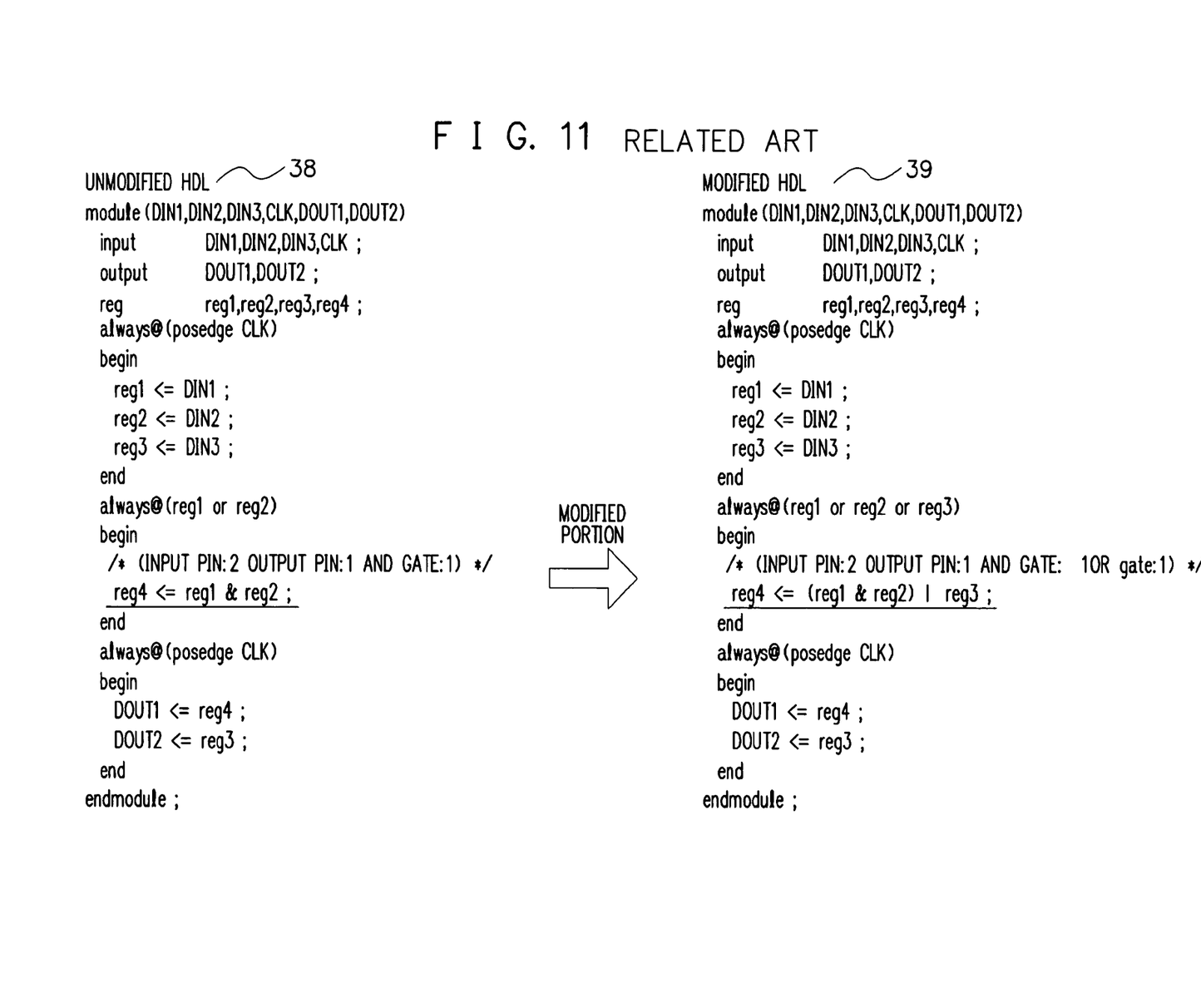
FIG. 11 shows an example of an unmodified HDL and an example of a modified HDL, illustrating the problems to be solved by the present invention.

In this conventional structure, however, the different portions between the HDL and the existing gate level logic circuit are not extracted. When a simple modification is made to a gate level logic circuit by replacing a two-input AND gate with a two-input OR gate (the two gate have the same arrangement of input pins and output pins) as in the case of the unmodified and modified gate level logic circuits shown in FIG. 2, a different portion replacement can be performed by changing a two-input AND operation to a two-input OR operation through the extraction of the different portions between the unmodified HDL and the modified HDL shown in FIG. 3. However, when different portions extracted from an unmodified HDL 35 and a modified HDL 36 shown in FIG. 11 are formed with gate level logic circuits having different arrangements of input pins and output pins, it is difficult to detect the portion to be replaced in the existing gate level logic circuit. As a result, a different portion replacement cannot be performed on the existing gate level logic circuit.

Further, when many modifications are to be made to a gate level logic circuit having complicated different portions or to an existing gate level logic circuit optimized through logic synthesis, appropriate extraction of different portions needs to be performed between a modified HDL and an existing gate level logic circuit.

SUMMARY OF THE INVENTION

An exemplary object of the invention is to provide a logic synthesis method or the likes that can shorten the execution time and the confirmation time required for logic re-synthesis and logic equivalence rechecking.

A logic synthesis method according to an exemplary aspect of the invention characteristically comprises the steps of: extracting logically different portions between an existing gate level logic circuit and a modified Hardware Description Language (HDL) description; hierarchizing the different portions between the existing gate level logic circuit and the modified HDL description; generating a gate level logic circuit by logically combining the hierarchized portions of the modified HDL description; and replacing the hierarchized portions of the existing gate level logic circuit with the gate level logic circuit.

A logic synthesis device according to an exemplary aspect of the invention characteristically includes: an extracting module that extracts logically different portions between an existing gate level logic circuit and a modified HDL description; a hierarchizing module that hierarchizes different portions between the existing gate level logic circuit and the modified HDL description; a difference logic synthesis module that generates a gate level logic circuit by logically combining the hierarchized portions of the modified HDL description; and a replacing module that replaces the hierarchized portions of the existing gate level logic circuit with the gate level logic circuit.

A computer program product according to an exemplary aspect of the invention causes the computer to perform: extracting logically different portions between an existing gate level logic circuit and a modified HDL description; hierarchizing the different portions between the existing gate level logic circuit and the modified HDL description; generating a gate level logic circuit by logically combining the hierarchized portions of the modified HDL description; and replacing the hierarchized portions of the existing gate level logic circuit with the gate level logic circuit.

BRIEF DESCRIPTION OF THE DRAWINGS

Features of the disclosed embodiments will be described by way of the following detailed description with reference to the accompanying drawings in which.

DESCRIPTION OF EXEMPLARY EMBODIMENTS

The following is a description of exemplary embodiments of the present invention, with reference to the accompanying drawings. For ease of explanation, the components that are equivalent to the components of the above described conventional logic synthesis device share the same reference numerals with the components of the conventional logic synthesis device.

Figure 1:
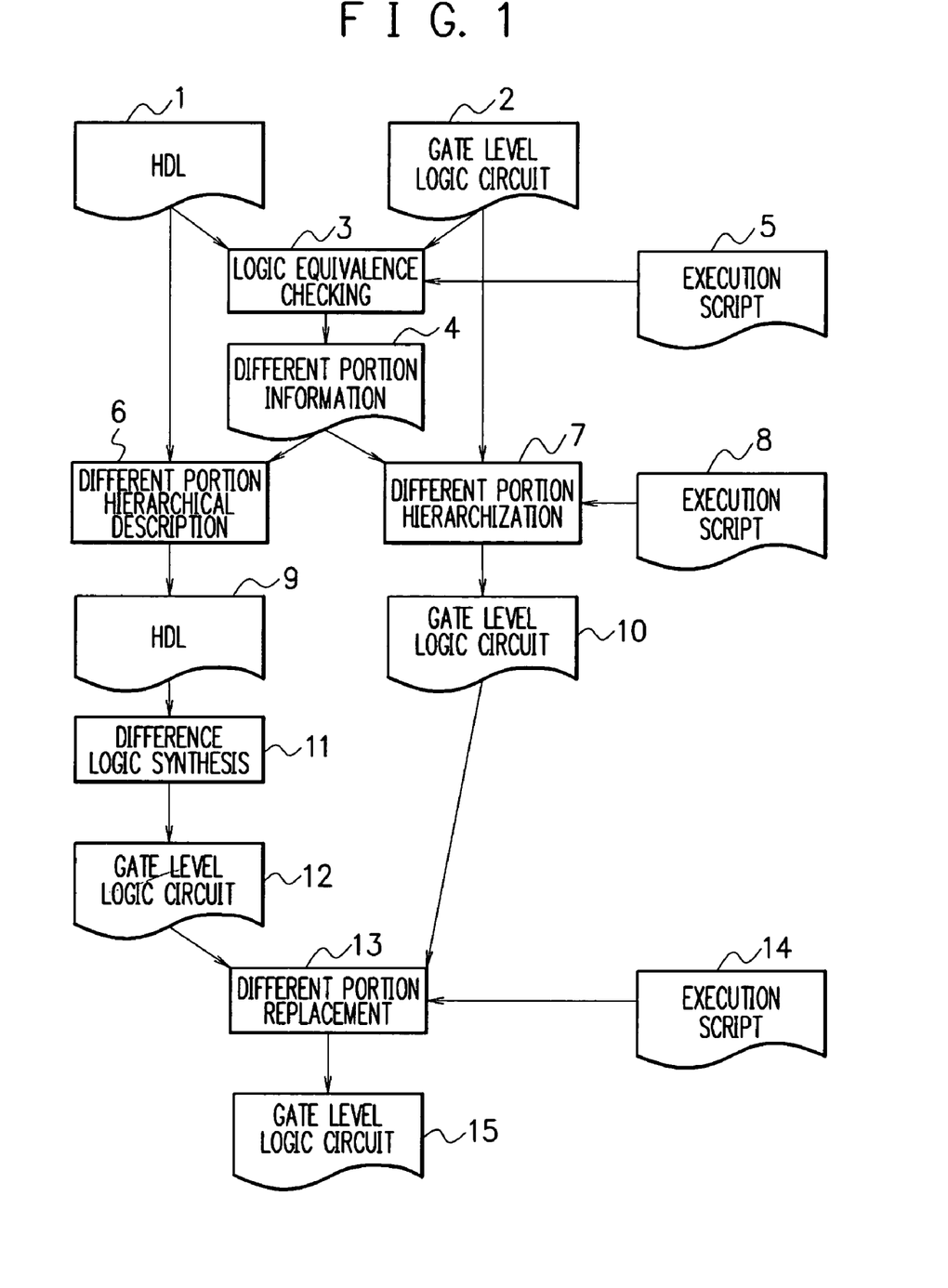
FIG. 1 shows an operation flow of an exemplary embodiment.

In FIG. 1, an HDL 1 is a modified HDL, and a gate level logic circuit 2 is an existing gate level logic circuit. Logic equivalence checking 3 is performed between the HDL 1 and the gate level logic circuit 2, and different portion information 4 is output. A logic equivalence checking tool is used for the logic equivalence checking 3. Based on the information 4, an HDL 9 is generated from the HDL 1 through a difference point hierarchical description 6.

As for the gate level logic circuit 2, a gate level logic circuit 10 is generated through different portion hierarchization 7 based on the information 4. A gate level logic circuit 12 is generated from the HDL 9 by performing difference logic synthesis 11 on the hierarchized different portions. A different portion replacement 13 is then performed to incorporate the gate level logic circuit 12 of the different portions with the gate level logic circuit 10, so as to generate a gate level logic circuit 15. A logic synthesis tool is used for the different portion hierarchization 7 and the different portion replacement 13.

Referring now to FIGS. 1 to 5, an operation to be performed by the logic synthesis device is described in detail.

Figure 2:
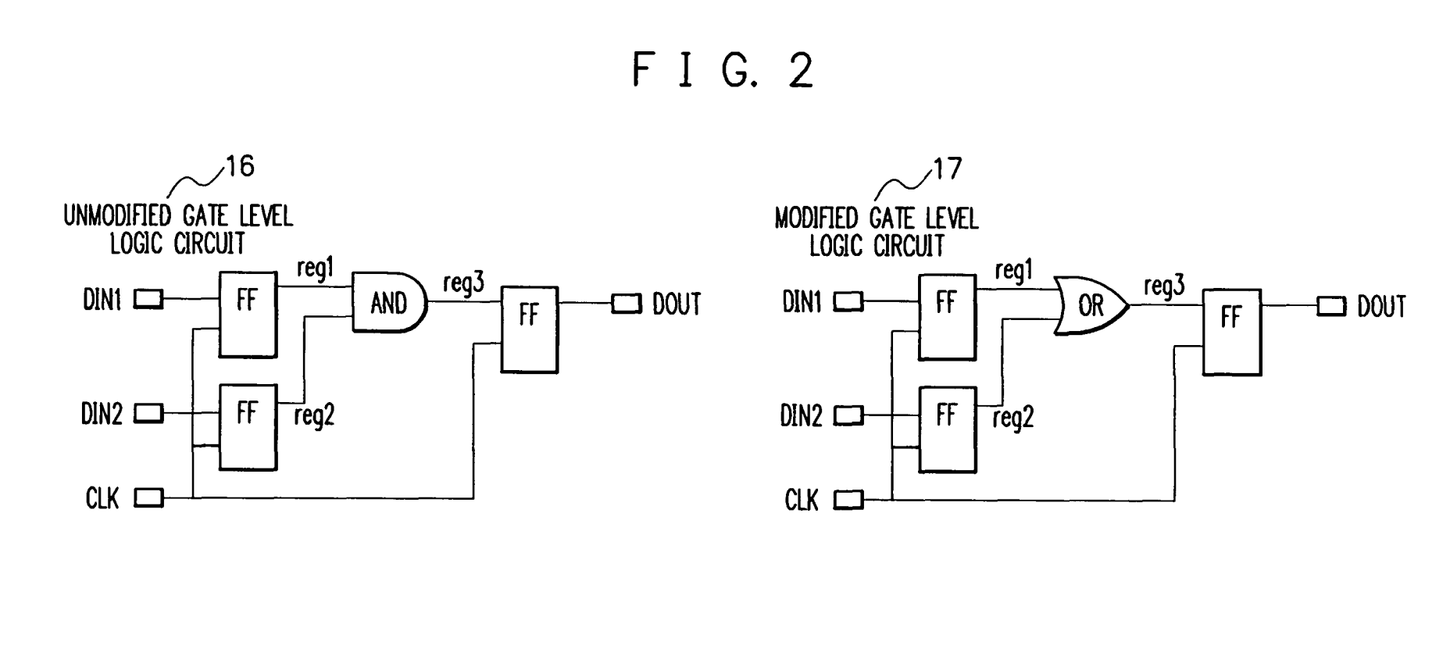
FIG. 2 shows an example of an unmodified gate level logic circuit and an example of a modified gate level logic circuit.

An unmodified gate level logic circuit 16 shown in FIG. 2 is equivalent to the gate level logic circuit 2 shown in FIG. 1. A modified gate level logic circuit 17 is equivalent to the gate level logic circuit 15 shown in FIG. 1. The gate level logic circuit 16 is generated by performing logic synthesis on an unmodified HDL 18. The modified gate level logic circuit 17 shown in FIG. 2 is generated by performing logic synthesis on a modified HDL 19. FIG. 4 shows the procedures for generating the different portion hierarchized HDL 9 from the modified HDL 19 shown in FIG. 3.

Figure 3:
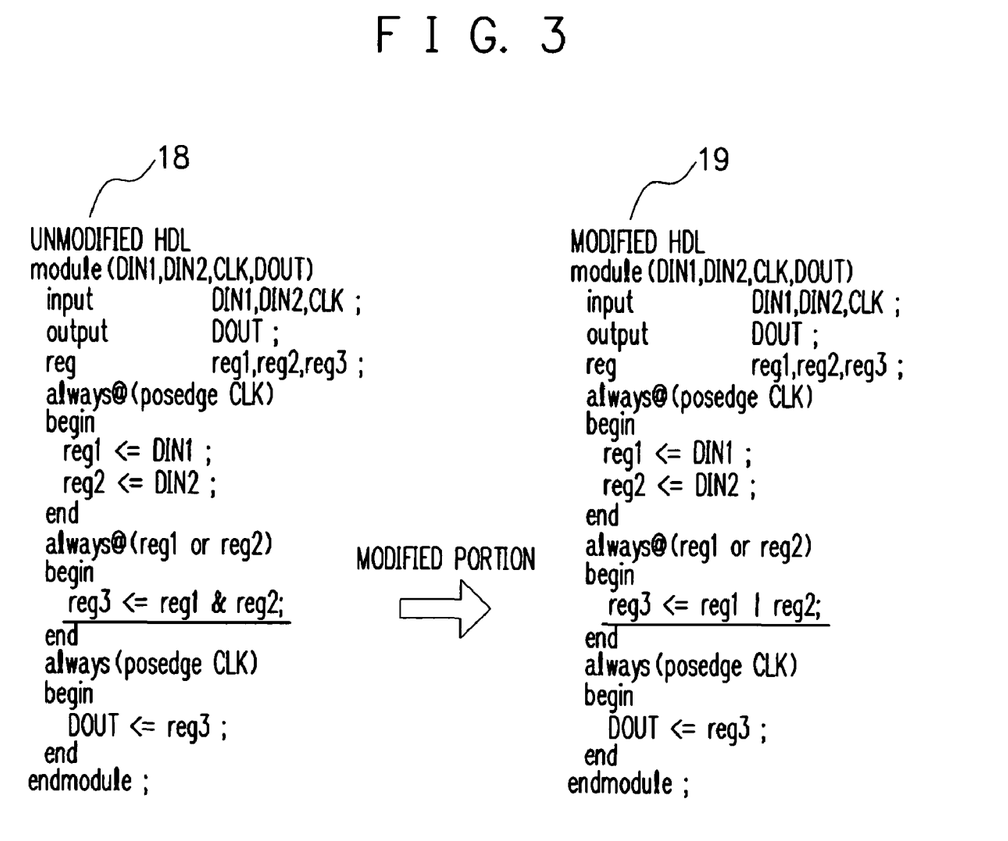
FIG. 3 shows an example of an unmodified HDL and an example of a modified HDL.
Figure 4:
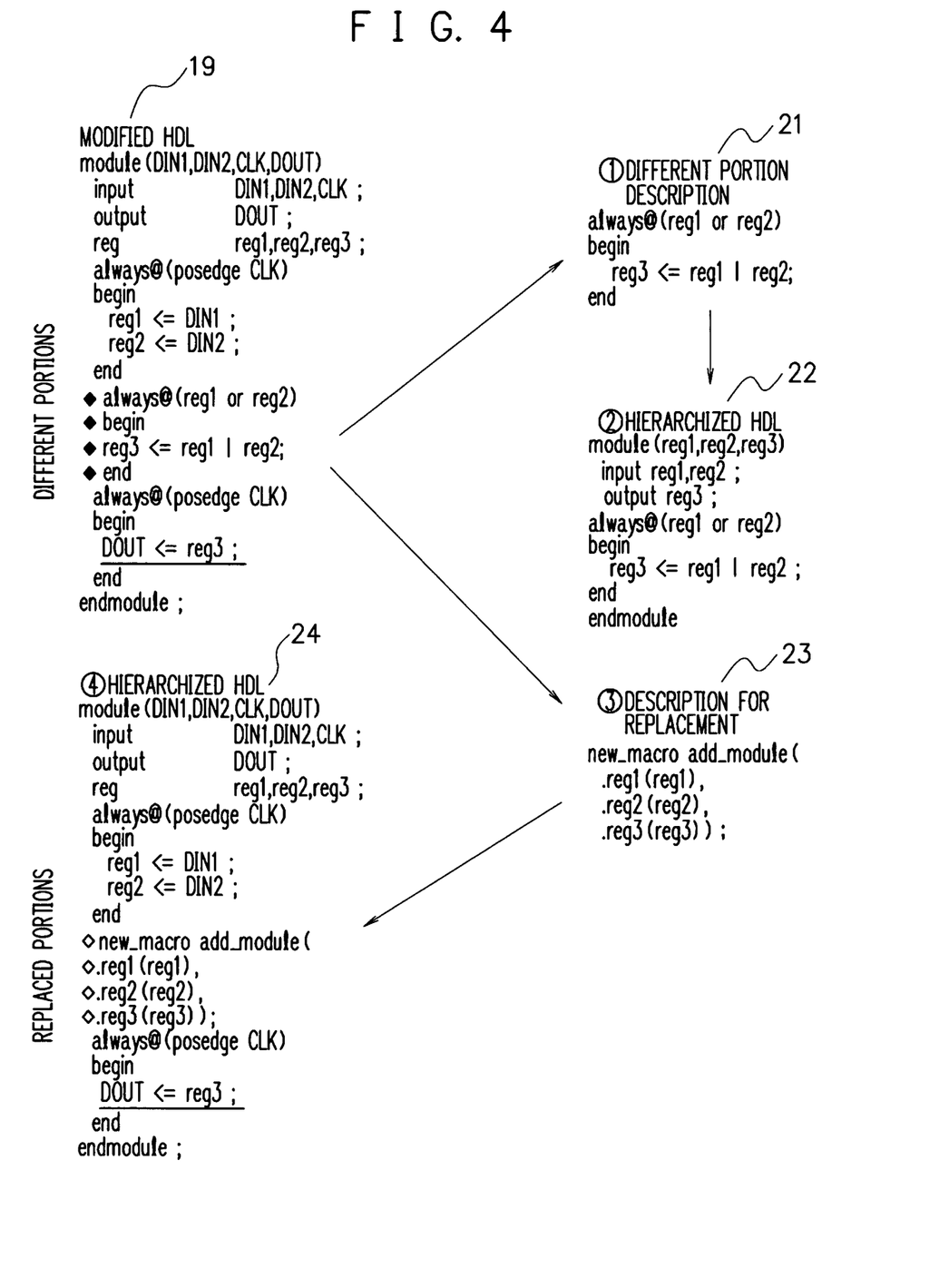
FIG. 4 shows the procedures for generating an HDL in which the different portions of the modified HDL are hierarchized.

Referring to FIG. 3, the HDL 1 shown in FIG. 1 is described. FIG. 3 shows an example case where a circuit change involving logic re-synthesis is made by modifying an HDL in accordance with a functional specification or the like. Underlined in each HDL is a target of modification.

The unmodified DHL 18 shown in FIG. 3 is modified to form the modified HDL 19 by use of a file editor and an EDA tool. The HDL 1 shown in FIG. 1 is an HDL for checking a portion different from the existing gate level logic circuit 2, and the modified HDL 19 shown in FIG. 3 is equivalent to the HDL 1.

Figure 5:
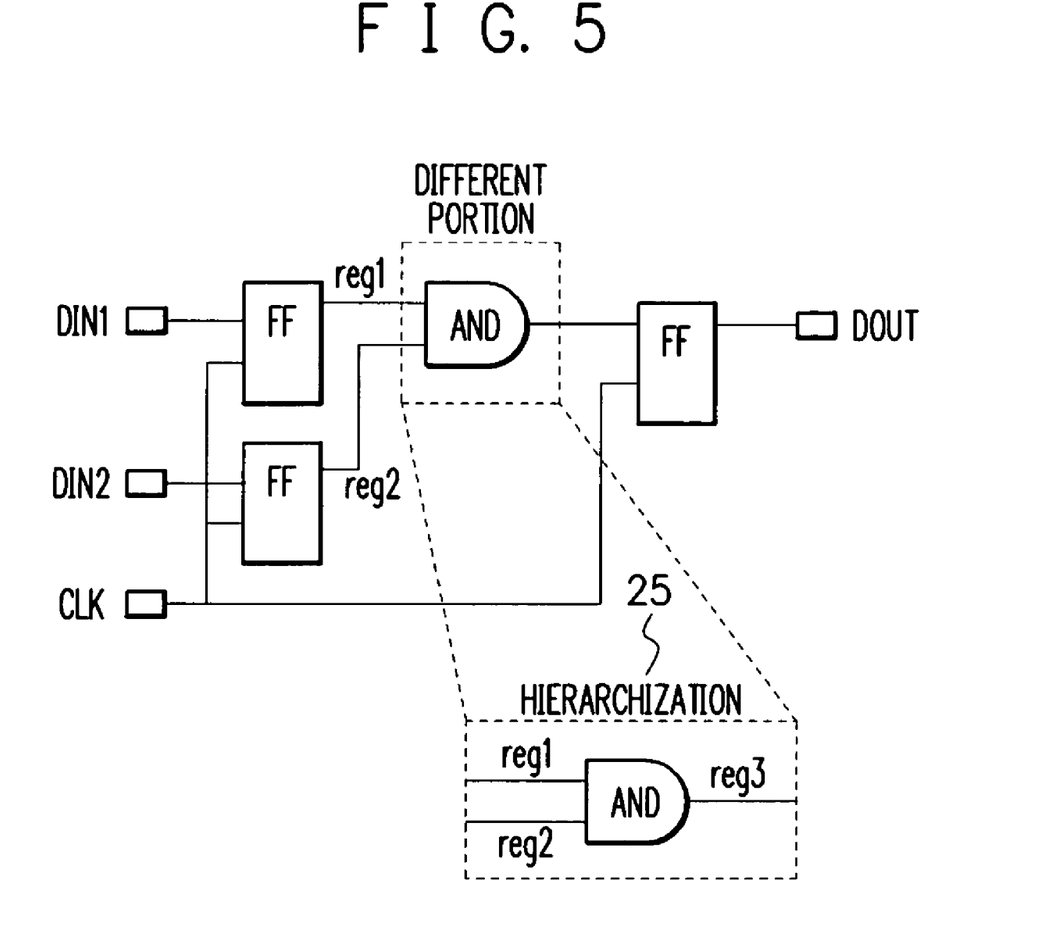
FIG. 5 shows a gate level logic circuit formed by hierarchizing different portions of a gate level logic circuit.

FIG. 5 shows a gate level circuit hierarchized through the different portion hierarchization 7 of FIG. 1. The portion of hierarchization 25 shown in FIG. 5 is the portion to be replaced with the gate level logic circuit generated through logic synthesis by use of a hierarchization HDL 22 shown in FIG. 4. The replacement is carried out by the different portion replacement 13 shown in FIG. 1. To detect the different portions between the HDL 1 and the gate level logic circuit 2 shown in FIG. 1, the logic equivalence checking 3 is performed. The logic equivalence checking 3 is performed by use of an existing logic equivalence checking tool. An execution script 5 for the logic equivalence checking 3 is automatically generated. The logic equivalence checking 3 is performed so as to output the information 4.

Based on the information 4, hierarchization is performed on the different portions between the HDL 1 and the gate level logic circuit 2. The hierarchization of the gate level logic circuit 2 is performed by use of an existing logic synthesis tool. An execution script 8 for the logic synthesis is automatically generated. The hierarchized gate level logic circuit shown in FIG. 5 is generated with a logic synthesis tool.

Referring now to FIG. 4, the procedures for generating the HDL 9 in which the different portions of the HDL 1 of FIG. 1 are hierarchized are described.

Based on the different portion information 4 outputted as a result of the logic equivalence checking 3 of FIG. 1, the different portions indicated by "♦" in a modified HDL 19 shown in FIG. 4 are detected, and a different portion description 21 is extracted. A hierarchized HDL 22 including the extracted different portion description 21 is then generated. Next, a replacement description 23 that is to replace the different portion of the HDL 1 is generated. With this description, the hierarchical relationship with the hierarchized HDL 22 is described. The different portions indicated by "♦" of the HDL 19 modified from the HDL 1 are replaced with the replacement description 23, so as to generate the hierarchized HDL 9. Through the above described procedures, the HDL 9 formed with the hierarchized HDL 24 and the hierarchized HDL 22 that are both obtained from the HDL 1 is generated.

The difference logic synthesis 11 of FIG. 1 is performed only with the hierarchized HDL 22 of the HDL 9, so as to generate the gate level logic circuit 12.

The different portion replacement 13 is performed by replacing the different portion hierarchized from the gate level logic circuit 10 with the gate level logic circuit 12. This procedure is carried out by use of an existing logic synthesis tool. An execution script 14 for the logic synthesis is automatically generated.

The logic equivalent checking 3 of FIG. 1 is performed by use of an existing logic equivalence checking tool. Also, an existing logic synthesis tool is used for the different portion hierarchization 7 and the different portion replacement 13.

The execution script 5, the execution script 8, and the execution script 14 to be used by the logic equivalence checking tool and the logic synthesis tool are automatically generated from script formats using execution commands prepared for the respective tools.

Second Exemplary Embodiment

In the logic synthesis method as described above, an execution script may be generated when the different portions of the modified HDL description is hierarchized with the existing gate level logic circuit, and when the existing gate level logic circuit is replaced.

Third Exemplary Embodiment

A logic synthesis device may include an execution script generating module that generates an execution script when the different portions of the modified HDL description is hierarchized with the existing gate level logic circuit and when the existing gate level logic circuit is replaced.

Fourth Exemplary Embodiment

A computer program product may cause the computer to perform a process of generating an execution script in the process of hierarchizing the different portions of the modified HDL description with the existing gate level logic circuit and in the process of replacing the existing gate level logic circuit.

As set forth above, in accordance with the present invention, a layer containing detected different portions is automatically generated in logic equivalence checking between a modified HDL and a gate level logic circuit, so that logic synthesis can be performed in each unit smaller than the unit for the conventional logic synthesis. Thus, the execution time and the confirmation time required for logic re-synthesis and logic equivalence rechecking can be shortened.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A logic synthesis method comprising the steps of:
extracting, using a computer, logically different portions between an existing gate level logic circuit and a modified Hardware Description Language (HDL) description;
hierarchizing, using the computer, the different portion between the existing gate level logic circuit and the modified HDL description;
generating a gate level logic circuit by logically combining the hierarchized portions of the modified HDL description; and
replacing the hierarchized portions of the existing gate level logic circuit with the gate level logic circuit, wherein an execution script is generated when the different portions of the modified HDL description are hierarchized with the existing gate level logic circuit and when the existing gate level logic circuit is replaced.

2. A logic synthesis device comprising:
an extracting module that extracts logically different portions between an existing gate level logic circuit and a modified Hardware Description Language (HDL) description;

a hierarchizing module that hierarchizes the different portions between the existing gate level logic circuit and the modified HDL description;

a difference logic synthesis module that generates a gate level logic circuit by logically combining the hierarchized portions of the modified HDL description;

a replacing module that replaces the hierarchized portions of the existing gate level logic circuit with the gate level logic circuit, and an execution script generating module that generates an execution script when the different portions of the modified HDL description are hierarchized with the existing gate level logic circuit and when the existing gate level logic circuit is replaced.

3. A computer program product causing the computer to perform:

extracting logically different portions between an existing gate level logic circuit and a modified Hardware Description Language (HDL) description;

hierarchizing the different portions between the existing gate level logic circuit and the modified HDL description;

generating a gate level logic circuit by logically combining the hierarchized portions of the modified HDL description; and replacing the hierarchized portions of the existing gate level logic circuit with the gate level logic circuit, wherein an execution script is generated in the process of hierarchizing the different portions of the modified HDL description with the existing gate level logic circuit and in the process of replacing the existing gate level logic circuit.

4. A logic synthesis device comprising:

extracting means for extracting logically different portions between an existing gate level logic circuit and a modified HDL (Hardware Description Language) description;

hierarchizing means for hierarchizing the different portions between the existing gate level logic circuit and the modified HDL description;

difference logic synthesis means for generating a gate level logic circuit by logically combining the hierarchized portions of the modified HDL description;

replacing means for replacing the hierarchized portions of the existing gate level logic circuit with the gate level logic circuit, and an execution script generating means for generating an execution script when the different portions of the modified HDL description are hierarchized with the existing gate level logic circuit and when the existing gate level logic circuit is replaced.

* * * * *